(12) United States Patent
Kim et al.

(10) Patent No.: US 11,251,344 B2
(45) Date of Patent: Feb. 15, 2022

(54) WHITE LIGHT EMITTING MODULE

(71) Applicant: SAMSUNG ELECTRONICS CO., LTD., Suwon-si (KR)

(72) Inventors: Seongmin Kim, Suwon-si (KR); Chohui Kim, Suwon-si (KR); Mi Hyae Park, Suwon-si (KR); Jeongeun Yun, Suwon-si (KR); Sungwoo Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 102 days.

(21) Appl. No.: 16/663,522

(22) Filed: Oct. 25, 2019

(65) Prior Publication Data

US 2020/0303598 A1 Sep. 24, 2020

(30) Foreign Application Priority Data

Mar. 22, 2019 (KR) .................. 10-2019-0033138

(51) Int. Cl.
*H01L 33/50* (2010.01)
*H05B 45/20* (2020.01)

(52) U.S. Cl.
CPC .......... *H01L 33/504* (2013.01); *H05B 45/20* (2020.01)

(58) Field of Classification Search
CPC .... H01L 33/504; H05B 45/20; F21K 9/61–64
See application file for complete search history.

(56) References Cited

U.S. PATENT DOCUMENTS

| 8,497,629 | B2 | 7/2013 | Chen et al. |
| 8,643,038 | B2 | 2/2014 | Collins et al. |
| 9,526,143 | B1 | 12/2016 | Petluri et al. |
| 9,642,515 | B2 | 5/2017 | Jaffe et al. |
| 9,788,387 | B2 | 10/2017 | Soler et al. |
| 9,827,440 | B2 | 11/2017 | Moore-Ede et al. |
| 10,018,776 | B2 * | 7/2018 | Itoh ...................... G02B 6/0026 |
| 2010/0002440 | A1 | 1/2010 | Negley et al. |
| 2011/0299277 | A1 * | 12/2011 | Ehara ................. H05B 47/16 362/231 |
| 2012/0008326 | A1 | 1/2012 | Jou |

(Continued)

FOREIGN PATENT DOCUMENTS

| JP | 2016-062887 | 4/2016 |
| KR | 10-2012-0093181 | 8/2012 |

(Continued)

*Primary Examiner* — Shaun M Campbell
(74) *Attorney, Agent, or Firm* — F. Chau & Associates, LLC

(57) ABSTRACT

Systems and methods are described for a white light emitting module that emits a third white light with the goal of providing human-friendly illumination. The white light emitting device comprise a first light emitting package that emits a first white light and a second light emitting package that emits a second white light. The first light emitting package includes a first light emitting device and a filter member that filters light emitted from the first light emitting device and then reduces a color temperature of the first white light. The second light emitting package includes second and third light devices. The color temperature of the first white light is about 1,500 K to about 4,000 K. A color temperature of the second white light is about 3,000 K to about 10,000 K.

20 Claims, 10 Drawing Sheets

(56) References Cited

U.S. PATENT DOCUMENTS

| | | |
|---|---|---|
| 2016/0076709 A1 | 3/2016 | Matsubayashi |
| 2017/0064785 A1 | 3/2017 | Kim et al. |
| 2017/0138570 A1 | 5/2017 | Ouderkirk |
| 2017/0276301 A1 | 9/2017 | David et al. |
| 2018/0130928 A1* | 5/2018 | Vick .................... H01L 33/502 |
| 2018/0149802 A1 | 5/2018 | Krames et al. |
| 2018/0231226 A1 | 8/2018 | Koo et al. |
| 2018/0317296 A1* | 11/2018 | Chen ...................... H05B 45/20 |
| 2019/0103523 A1 | 4/2019 | Choi et al. |
| 2020/0057339 A1* | 2/2020 | Chen ................. G02F 1/133621 |

FOREIGN PATENT DOCUMENTS

| | | |
|---|---|---|
| KR | 10-2018-0092629 | 8/2018 |
| KR | 10-2019-0038394 | 4/2019 |

\* cited by examiner

WHITE LIGHT EMITTING MODULE

CROSS-REFERENCE TO RELATED APPLICATION

This U.S. nonprovisional application claims priority under 35 U.S.C. § 119 to Korean Patent Application No. 10-2019-0033138 filed on Mar. 22, 2019 in the Korean Intellectual Property Office, the disclosure of which is hereby incorporated by reference herein in its entirety.

BACKGROUND

The present inventive concepts relate to light emitting devices, and more specifically to a white light emitting module.

Development of light emitting devices has been accelerated due to high demand. Such light emitting devices are in widespread use in illumination, display devices, and light sources. Light emitting devices may impact circadian rhythms. Circadian rhythms refer to physical, mental, and behavioral changes that follow a daily cycle. These changes respond to light and darkness in the environment. Sleeping at night and being awake during the day is an example of a light-related circadian rhythm. Circadian rhythms are found in most living things, including animals, plants, and many tiny microbes.

There has recently been a need for lighting devices that consider human biorhythms, such as circadian rhythms, and other human elements such as retinal sensitivity. For example, there is a need for such human-friendly light emitting devices capable of being used in light emitting diode (LED) lighting devices.

SUMMARY

Some exemplary embodiments of the present inventive concepts provide a white light emitting module for human-friendly illumination.

According to some exemplary embodiments of the present inventive concepts, a white light emitting module that emits a third white light may comprise: a first light emitting package that emits a first white light; and a second light emitting package that emits a second white light. The first white light and the second white light may be mixed to produce the third white light. The first light emitting package may include: a first light emitting device that emits a first blue light having a first peak wavelength; and a first wavelength conversion part that encapsulates the first light emitting device and converts at least a portion of a wavelength of the first blue light into the first white light. The second light emitting package may include: a second light emitting device that emits a second blue light; a third light emitting device that emits a third blue light, the second blue light having the first peak wavelength and the third blue light having a second peak wavelength; and a second wavelength conversion part that encapsulates the second light emitting device and the third light emitting device, the second wavelength conversion part converting at least a portion of each wavelength of the second blue light and the third blue light into the second white light. A color temperature of the first white light may be 1,500 K to 3,000 K. A color temperature of the second white light may be 4,000 K to 10,000 K. The first peak wavelength may be between 445 nm and 455 nm. The second peak wavelength may be between 465 nm and 495 nm. The third white light may have a relative intensity ranging from 0.2 to 1.1 of the second peak wavelength with respect to the first peak wavelength.

According to some exemplary embodiments of the present inventive concepts, a white light emitting module that emits a third white light may comprise: a first light emitting package that emits a first white light; and a second light emitting package that emits a second white light. The first white light and the second white light may be mixed to produce the third white light. The first light emitting package may include: a first light emitting device that emits a first blue light having a peak wavelength between 445 nm and 455 nm; a first wavelength conversion part that encapsulates the first light emitting device and converts at least a portion of a wavelength of the first blue light into the first white light; and a filter member that filters the first blue light and absorbs a wavelength band of 570 nm to 590 nm from the first blue light.

The second light emitting package may include: a second light emitting device that emits a second blue light and a third blue light, the second blue light having a first peak wavelength; a third light emitting device that emits the third blue light having a second peak wavelength; and a second wavelength conversion part that encapsulates the second light emitting device and the third light emitting device, the second wavelength conversion part converting at least a portion of each wavelength of the second blue light and the third blue light into the second white light. A temperature of the first white light may be in a range of 1,500 K to 3,000 K. A color temperature of the second white light may be in a range of 3,000 K to 10,000 K. A temperature of the third white light may be in a range of 1,500 K to 10,000 K. Within the range of 1,500 K to 3,000 K, the third white light may have a relative intensity equal to or less than 50% of the wavelength band between 570 nm and 590 nm to a reference light whose color temperature is the same as that of the third white light.

According to some embodiments of the present inventive concepts, a light emitting module comprises: a first light emitting package that emits a first white light; and a second light emitting package that emits a second white light having a different color temperature than the first white light, wherein the first light emitting package includes: a first light emitting device that emits a first colored light; and a first wavelength conversion part that converts at least a portion of the first colored light into at least a portion of the first white light, and wherein the second light emitting package includes: a second light emitting device that emits a second colored light; and a second wavelength conversion part that converts at least a portion of the second colored light into at least a portion of the second white light. The first light emitting package is configured to emit the first white light with a first Melanopic Daylight Equivalent Factor (MDEF) index, and the second light emitting package is configured to emit the second white light with a second MDEF index that is higher than the first MDEF index.

Details of other exemplary embodiments are included in the description and drawings.

DETAILED DESCRIPTION OF EMBODIMENTS

The present disclosure describes a white light emitting module that provides human-friendly illumination. Embodiments of the white light emitting module include a first light emitting package that emits a first white light and a second light emitting package that emits a second white light. A third white light is produced when the first white light and the second white light are mixed.

The first light emitting package may include a first light emitting device and a filter member. The filter member may absorb a yellow-color wavelength component emitted from the first light emitting device. Therefore, the first light emitting package may have a low Melanopic Daylight Equivalent Factor (MDEF) index, which may increase the secretion of melatonin. Thus, the first light emitting package may have be suitably used for illumination in the evening or night.

The second light emitting package may include second and third light emitting devices, and may emit light which has a high MDEF index. This may suppress the secretion of melatonin. Thus, the second light emitting package may increase the desire for activity, which may be suitable for use in the morning or daytime.

The following will now describe in detail some exemplary embodiments of the present inventive concepts with reference to the accompanying drawings.

Figure 1:
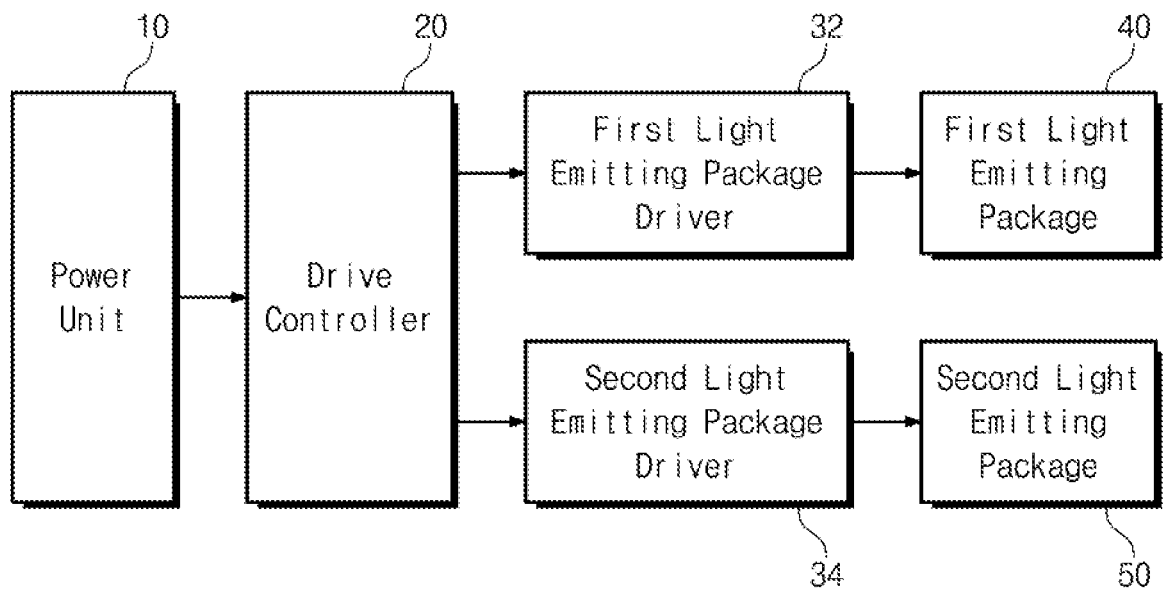
FIG. 1 illustrates a schematic block diagram showing a light emitting module according to some exemplary embodiments of the present inventive concepts.

FIG. 1 illustrates a schematic block diagram showing a light emitting module 1 according to some exemplary embodiments of the present inventive concepts.

Referring to FIG. 1, the light emitting module 1 may include a power unit 10, a drive controller 20, first light emitting package driver 32, second light emitting package driver 34, first light emitting package 40, and second light emitting packages 50. The light emitting module 1 may be a white light emitting module. The first light emitting package 40 may emit a first white light (see WL1 of FIG. 2), the second light emitting package 50 may emit a second white light (see WL2 of FIG. 2), and the light emitting module 1 may emit a third white light (see WL3 of FIG. 2) that is a mixture of the first white light WL1 and the second white light WL2.

The first light emitting package 40 may have a color temperature less than that of the second light emitting package 50. The first light emitting package 40 may provide a cool color temperature, and the second light emitting package 50 may provide a warm color temperature. For example, the first light emitting package 40 may be suitably used in the evening or night, and the second light emitting package 50 may be suitably used in the morning or daytime.

The power unit 10 may provide power to the first and second light emitting packages 40 and 50. For example, the power unit 10 may provide one or more of the first and second light emitting packages 40 and 50 with power through the drive controller 20 and the first and second light emitting package drivers 32 and 34. The power unit 10 may include a power source (not shown) and a power supply circuit (not shown). The power source (not shown) may be an alternating power (e.g., 220V-60 Hz). The power supply circuit (not shown) may include a rectifier circuit (e.g., diode-bridge circuit) that may rectify the alternating power and a compensation circuit (e.g., valley-fill circuit) that may compensate an output of the rectifier circuit at a certain time period.

The drive controller 20 may use the first light emitting package driver 32 and second light emitting package driver 34 to control the first light emitting package 40 and second light emitting package 50 independently of each other. The drive controller 20 may include a switch module. For example, the drive controller 20 may control a ratio of drive currents correspondingly applied to the first and second light emitting packages 40 and 50. The drive controller 20 may be drive signal controller or drive current controller.

In some examples, the light emitting module 1 (e.g., via the drive controller 20) may control the emission of light based on input from a user. In other cases, the emission of light may be controlled based on a timer, based on sensor input, or based on learning the behavior of a user.

The first light emitting package driver 32 may drive the first light emitting package 40. The first light emitting package driver 32 may provide the first light emitting package 40 with a current applied through the drive controller 20. The second light emitting package driver 34 may drive the second light emitting package 50. The second light emitting package driver 34 may provide the second light emitting package 50 with a current applied through the drive controller 20.

The first light emitting package 40 may have a color temperature ranging from about 1,500 K to about 3,000 K. For example, the color temperature of the first light emitting package 40 may be about 1,500 K, but the present inventive concepts are not limited thereto. In certain embodiments, the color temperature of the first light emitting package 40 may be about 2,200 K.

The second light emitting package 50 may have a color temperature ranging from about 3,000 K to about 10,000 K. For example, the color temperature of the second light emitting package 50 may be about 10,000 K, but the present inventive concepts are not limited thereto. In certain embodiments, the color temperature of the second light emitting package 50 may be about 6,500 K.

According to some embodiments of the present inventive concepts, the light emitting module 1 comprises the first light emitting package 40 that emits a first white light; and a second light emitting package 50 that emits a second white light having a different color temperature than the first white light, wherein the first light emitting package includes a first light emitting device that emits a first colored light; and a first wavelength conversion part that converts at least a portion of the first colored light into at least a portion of the first white light, and wherein the second light emitting package includes: a second light emitting device that emits a second colored light; and a second wavelength conversion part that converts at least a portion of the second colored light into at least a portion of the second white light.

In some examples, the first light emitting package 40 is configured to emit the first white light with a first Melanopic Daylight Equivalent Factor (MDEF) index, and the second light emitting package 50 is configured to emit the second white light with a second MDEF index that is higher than the first MDEF index.

In some examples, the light emitting module further comprises a control unit (e.g., the drive controller 20, operating in conjunction with other sensor and control components) configured to identify a daytime period and a nighttime period, and to emit a first combination of the first white light and the second white light during the daytime period and a second combination of the first white light and the second white light during the nighttime period, wherein the first combination comprises a lower ratio of the first white light to the second white light than the second combination.

Figure 2:
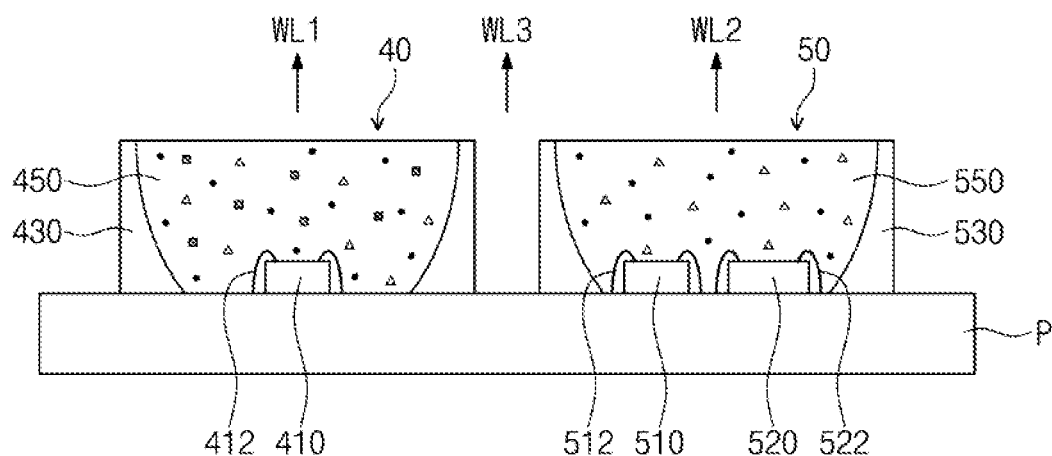
FIG. 2 illustrates a simplified cross-sectional view showing first and second light emitting packages according to some exemplary embodiments of the present inventive concepts.

FIG. 2 illustrates a simplified cross-sectional view showing the first and second light emitting packages 40 and 50 according to some exemplary embodiments of the present inventive concepts. The first and second light emitting packages 40 and 50 may be mounted on a package substrate P. The package substrate P may be a printed circuit board (PCB), but the present inventive concepts are not limited thereto.

Figure 3:
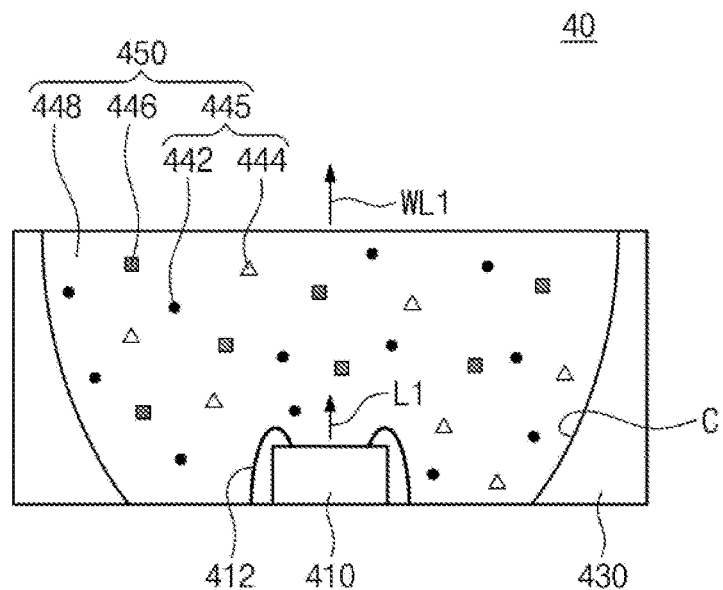
FIG. 3 illustrates a cross-sectional view showing the first light emitting package of FIG. 2.

FIG. 3 illustrates a cross-sectional view showing the first light emitting package 40 of FIG. 2. Referring to FIGS. 2 and 3, the first light emitting package 40 may be a chip scale package. The first light emitting package 40 may include a first light emitting device 410, a first housing 430, and a first wavelength conversion part 450.

The first light emitting device 410 may be a light emitting diode chip, but the present inventive concepts are not limited thereto. The first light emitting device 410 may be electrically connected through first wires 412 to electrodes (not shown) on the package substrate P.

In another example, the first light emitting device 410 may be flip-chip bonded to the package substrate P.

The first light emitting device 410 may emit, for example, a first light L1 having a first peak wavelength. The first peak wavelength may fall within a range of about 445 nm to about 455 nm. The first light L1 may be blue light. The first light L1 may also be called hereinafter a first blue light L1. For example, the first light emitting device 410 may emit the first light L1 having a peak wavelength of about 450 nm. For another example, the first light emitting device 410 may emit the first light L1 having a peak wavelength of 430 nm.

The first housing 430 may be provided to encapsulate the first light emitting device 410. The first housing 430 may be shaped like, for example, a C-shaped or U-shaped cavity C, but is not limited as such. The shape of the first housing 430 may be determined on an as-needed basis.

The first wavelength conversion part 450 may fill the C-shaped or U-shaped cavity C of the first housing 430. The first wavelength conversion part 450 may be provided to cover the first light emitting device 410. The first wavelength conversion part 450 may include a first wavelength conversion material 445, a first light transmitting resin 448, and a filter member 446.

The first wavelength conversion part 450 may convert at least a portion of the first light L1, which is emitted from the first light emitting device 410, into light having a different wavelength. For example, at least a portion of the blue light emitted from the first light emitting device 410 may be converted into yellow light. Additionally or alternatively, at least a portion of the blue light emitted from the first light emitting device 410 may be converted into red light, green light, or both. Thus the first light emitting package 40 may be configured to emit the first white light WL1.

The first wavelength conversion material 445 may be contained in the first light transmitting resin 448. The first wavelength conversion material 445 may include a third wavelength conversion material 442 and a fourth wavelength conversion material 444. For example, the third wavelength conversion material 442 may emit light having a fourth peak wavelength. The fourth peak wavelength may fall within a range of about 520 nm to about 560 nm. The fourth wavelength conversion material 444 may emit light having a peak wavelength of about 600 nm to about 645 nm. The third wavelength conversion material 442 may include, for example, at least one green phosphor selected from (Ga, Gd, Y)$_2$Al$_5$O$_{12}$:Ce, La$_3$Si$_6$Ni:Ce, Eu-doped (Sr, Ca, Ba)Si$_2$O$_2$N$_2$:Eu, (Sr, Ba)Si$_2$O$_4$:Eu, or any combination thereof. The fourth wavelength conversion material 444 may include, for example, at least one red phosphor selected from (Sr,Ca)AlSiN$_3$:Eu, CaAlSiN$_3$:Eu, K$_x$SiF$^y$:Mn$^{4+}$ (2≤x≤3, 4≤y≤7) (also referred to as KSF), or any combination thereof.

The first light transmitting resin 448 may include epoxy, silicone, modified silicone, a urethane resin, an oxetane resin, acryl, polycarbonate, polyimide, or a combination thereof.

The filter member 446 may include a material that filters a specific wavelength of light emitted through the first wavelength conversion part 450 from the first light emitting package 40. For example, the filter member 446 may include neodymium (Nd). For another example, the filter member 446 may include fluorine (F). The filter member 446 may absorb a yellow-color wavelength band from the first light L1. For example, the filter member 446 may absorb light having a third peak wavelength from the first light L1, which third peak wavelength may be in a range from about 530 nm to about 590 nm. The third peak wavelength may fall within a range of, for example, 570 nm to 590 nm.

In certain embodiments, the first wavelength conversion part 450 may convert the first light L1 emitted from the first light emitting device 410, and then the first light emitting package 40 may emit the first white light WL1. The first white light WL1 may include a first portion of the first light L1 and a second portion of the first light L1 that has passed through the first wavelength conversion part 450. The first light L1 may be divided into a first portion, a second portion that is converted by the first wavelength conversion material 445, and a third portion passing through the filter member 446. The first white light WL1 may conceptually include the portions of the first light L that are mixed with each other, but the present inventive concepts are not limited thereto.

Figure 4:
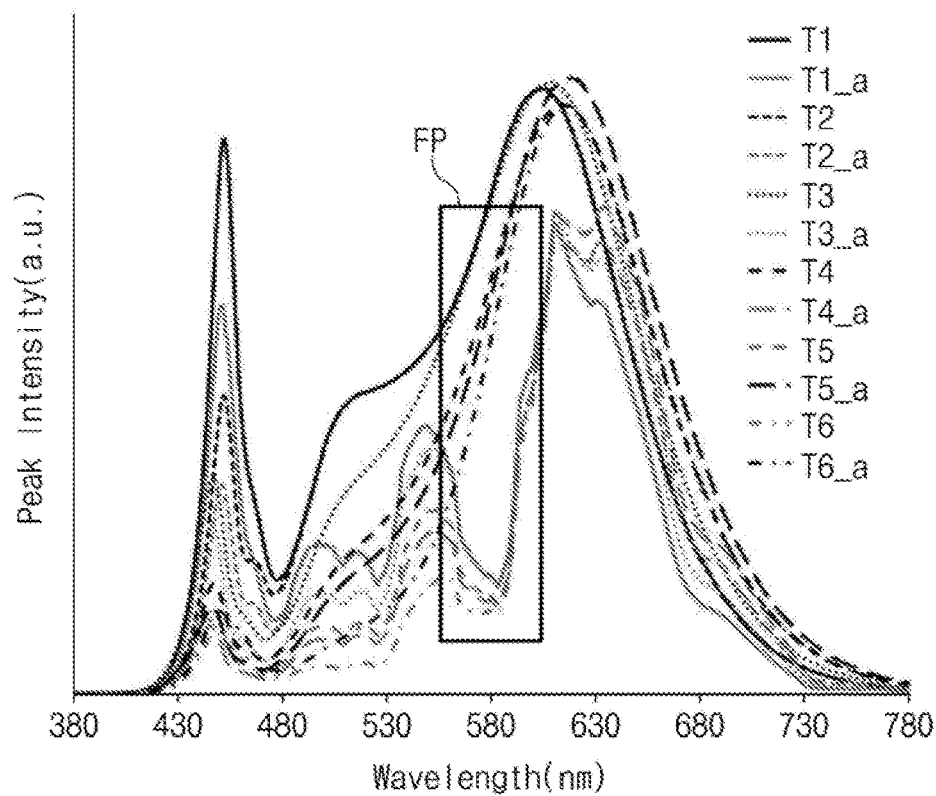
FIG. 4 illustrates a spectrum of an example including a filter member.

FIG. 4 illustrates a spectrum of an example including the filter member 446. Referring to FIG. 4, T1 to T6 relate to spectrums of examples including the filter member 446, and T1_a to T6_a relate to spectrums of other examples including no filter member. For example, symbols T1, T2, T3, T4, T5, and T6 may indicate 3000 K, 2700 K, 2300 K, 1900 K, 1700 K, and 1500 K, respectively. T1_a, T2_a, T3_a, T4_a, T5_a, and T6_a may indicate the same temperatures of T1, T2, T3, T4, T5, and T6, respectively. Compared to T1_a to T6_a, FIG. 4 shows that each case represented by T1 to T6, i.e., examples including the filter member 446, has intensity reduced due to absorption of the yellow-color wavelength band, for example, ranging from about 550 nm to about 600 nm (see FP of FIG. 4).

Figure 5:
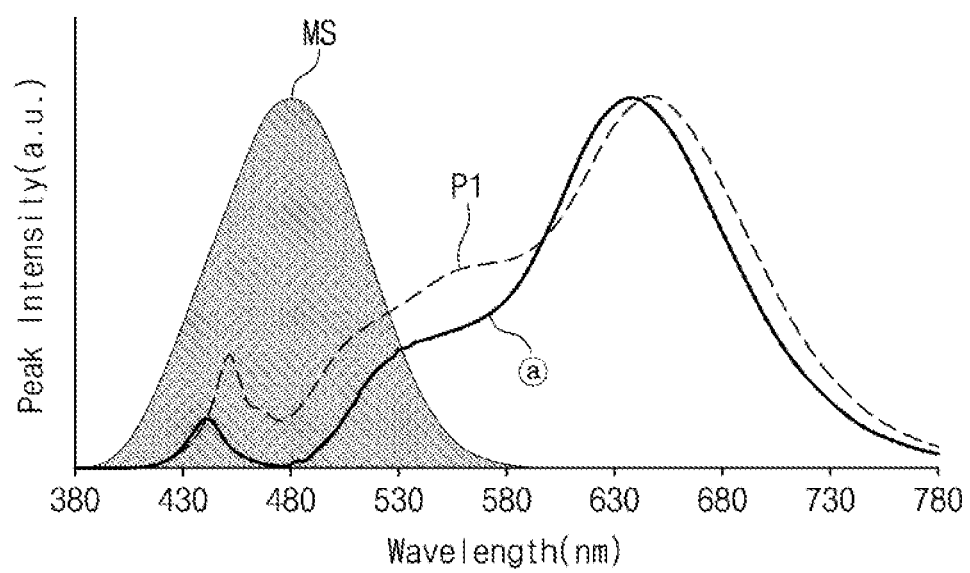
FIG. 5 illustrates a spectrum of the first light emitting package shown in FIG. 3.

FIG. 5 illustrates a light spectrum of the first light emitting package 40 shown in FIG. 3. In FIG. 5, the line ⓐ denotes a spectrum of the first light emitting package 40 according to the present inventive concepts, the line P1 indicates a spectrum according to a comparative example, and MS means the MDEF sensitivity of each wavelength. For example, a color temperature of may be 1,500 K, and a color temperature of P1 may be 2,700 K. Referring to FIG. 5, it may be found that, compared to P1, ⓐ has a low MDEF index, which increases the secretion of melatonin. For example, the first light emitting package 40 according to the present inventive concepts may allow users to take a comfortable rest, which may be suitable for illumination in the evening or night.

Figure 6:
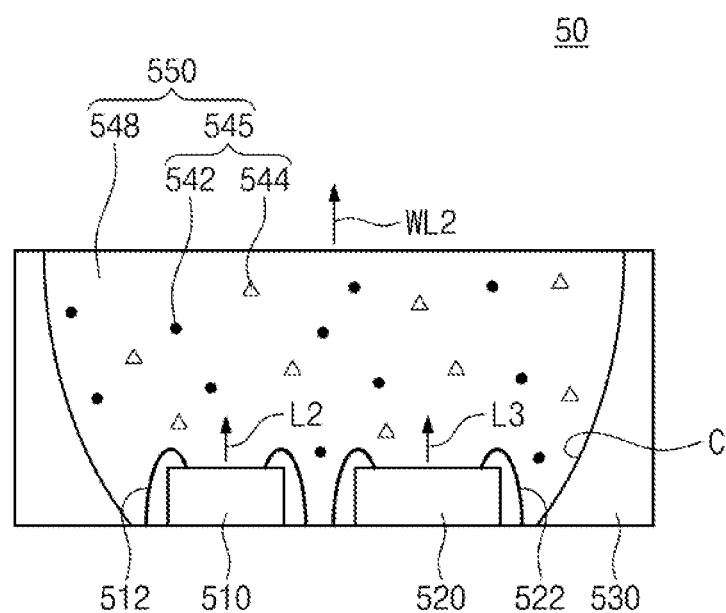
FIG. 6 illustrates a cross-sectional view showing the second light emitting package of FIG. 2.

FIG. 6 illustrates a cross-sectional view showing the second light emitting package 50 of FIG. 2. Referring to FIGS. 2 and 6, the second light emitting package 50 may be a chip scale package. The second light emitting package 50 may include a second light emitting device 510, a third light emitting device 520, a second housing 530, and a second wavelength conversion part 550.

The second light emitting device 510 may be a light emitting diode chip, but the present inventive concepts are not limited thereto. The second light emitting device 510 may be electrically connected through second wires 512 to electrodes (not shown) on the package substrate P. In another example, the second light emitting device 510 may be flip-chip bonded to the package substrate P.

The third light emitting device 520 may be a light emitting diode chip, but the present inventive concepts are not limited thereto. The third light emitting device 520 may be electrically connected through third wires 522 to electrodes (not shown) on the package substrate P. In another example, the third light emitting device 520 may be flip-chip bonded to the package substrate P.

The second light emitting device 510 may emit, for example, a second light L2 having a peak wavelength of about 445 nm to about 455 nm. The second light L2 may be blue light but is not limited as such. The second light L2 may also be called hereinafter a second blue light L2. For example, the second light emitting device 510 may emit the second light L2 having a peak wavelength of 450 nm.

The third light emitting device 520 may emit, for example, a third light L3 having a second peak wavelength. The second peak wavelength may fall within a range of about 465 nm to about 495 nm. The third light L3 may also be called hereinafter a third blue light L3. The third light L3 may be blue light which produces a cyan color. For example, the third light emitting device 520 may emit the third light L3 having a peak wavelength of 480 nm. The third blue light L3 emitted from the third light emitting device 520 may have a longer wavelength than that of the second blue light L2 emitted from the second light emitting device 510. Therefore, the third light emitting device 520 may have a greater area than that of the second light emitting device 510, which may increase luminance efficiency. However, the present inventive concepts are not limited thereto.

The second housing 530 may be provided to encapsulate the second light emitting device 510 and the third light emitting device 520. The second housing 530 may be shaped like, for example, a C-shaped or U-shaped cavity C, but is not limited as such. The shape of the second housing 530 may be determined on an as-needed basis.

The second wavelength conversion part 550 may fill the C-shaped or U-shaped cavity C of the second housing 530. The second wavelength conversion part 550 may be provided to cover the second light emitting device 510 and the third light emitting device 520. The second wavelength conversion part 550 may include a second wavelength conversion material 545 and a second light transmitting resin 548. The second wavelength conversion part 550 may convert at least a portion of each of the second light L2 and the third light L3, which are respectively emitted from the second light emitting device 510 and the third light emitting device 520, into light having a different wavelength. For example, at least a portion of the blue light emitted from each of the second light emitting device 510 and the third light emitting device 520 may be converted into yellow light, red light, green light, or any combination thereof. Thus the second light emitting package 50 may be configured to emit the second white light WL2.

The second wavelength conversion material 545 may be contained in the second light transmitting resin 548. The second wavelength conversion material 545 may include a fifth wavelength conversion material 542 and a sixth wavelength conversion material 544. For example, the fifth wavelength conversion material 542 may emit light having a peak wavelength of about 520 nm to about 550 nm, and the sixth wavelength conversion material 544 may emit light having a peak wavelength of about 600 nm to about 645 nm. The fifth wavelength conversion material 542 may include at least one phosphor selected from Ga—$Y_3Al_5O_{12}$ (also referred to as YAG), $Al_5Lu_3O_{12}$, $Y_3Al_5O_{12}$, $Y_3Al_5Lu_3O_{12}$, or any combination thereof. The sixth wavelength conversion material 544 may include, for example, at least one red phosphor selected from $(Sr,Ca)AlSiN_3$:Eu, $CaAlSiN_3$:Eu, $K_xSiF_y$:$Mn^{4+}$ ($2 \le x \le 3$, $4 \le y \le 7$) (also referred to as KSF), or any combination thereof.

The second light transmitting resin 548 may include epoxy, silicone, modified silicone, a urethane resin, an oxetane resin, acryl, polycarbonate, polyimide, or a combination thereof.

In certain embodiments, the second wavelength conversion part 550 may convert the second light L2 and the third light L3 which are respectively emitted from the second light emitting device 510 and the third light emitting device 520, and the second light emitting package 50 may emit the second white light WL2. The second white light WL2 may include a first portion of the second light L2, a second portion of the second light L2, a first portion of the third light L3, and a second portion of the third light L3, which other portions have passed through the second wavelength conversion part 550. For example, each of the second light L2 and the third light L3 may be divided into a first portion and a second portion that is converted by the second wavelength conversion material 545. The second white light WL2 may conceptually include portions of the second light L2 and the third light L3, which may be mixed with each other. However, the present inventive concepts are not limited thereto.

The second light emitting package 50 may be configured such that the second light L2 is employed together with the third light L3 that is relatively soft, which may result in a reduction in blue light hazard (BLH). In addition, the blue light hazard (BLH) may reduce by adjusting a ratio of intensities of the second and third lights L2 and L3.

Figure 7:
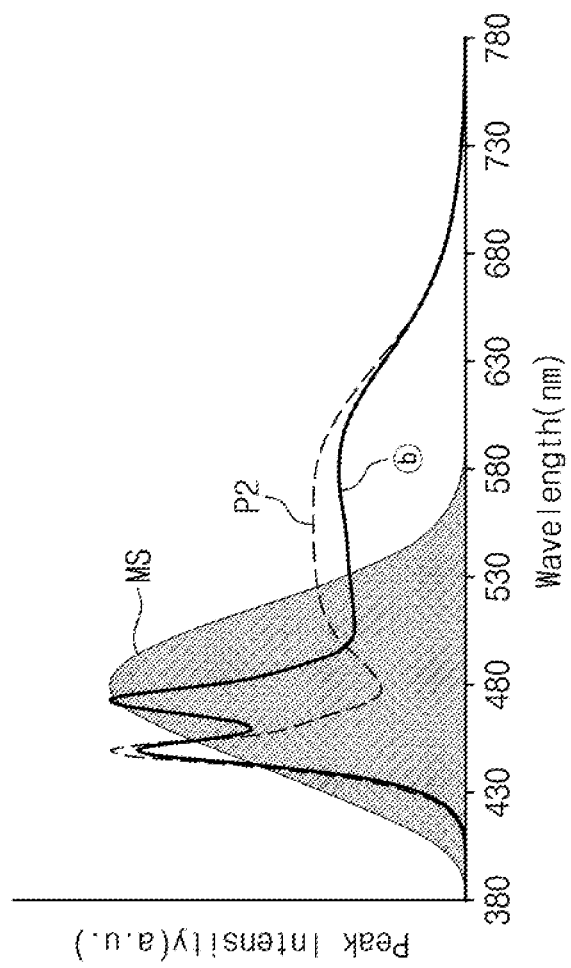
FIG. 7 illustrates a spectrum of the second light emitting package shown in FIG. 6.

FIG. 7 illustrates a spectrum of the second light emitting package 50 shown in FIG. 6. In FIG. 7, ⓑ denotes a spectrum of the second light emitting package 50 according to the present inventive concepts, P2 indicates a spectrum according to a comparative example, and MS means MDEF sensitivity. For example, a color temperature of ⓑ may be 10,000 K, and a color temperature of P2 may be 6,500 K. Referring to FIG. 7, compared to P2, ⓑ may have a high MDEF index and suppress the secretion of melatonin. For example, the second light emitting package 50 according to the present inventive concepts may increase activity of users and be suitable for illumination in the morning or daytime. In addition, P2 may have a single peak at a blue-color wavelength band, whereas the second light emitting package 50 may have a dual peak at the blue-color wavelength band.

Figure 8A:
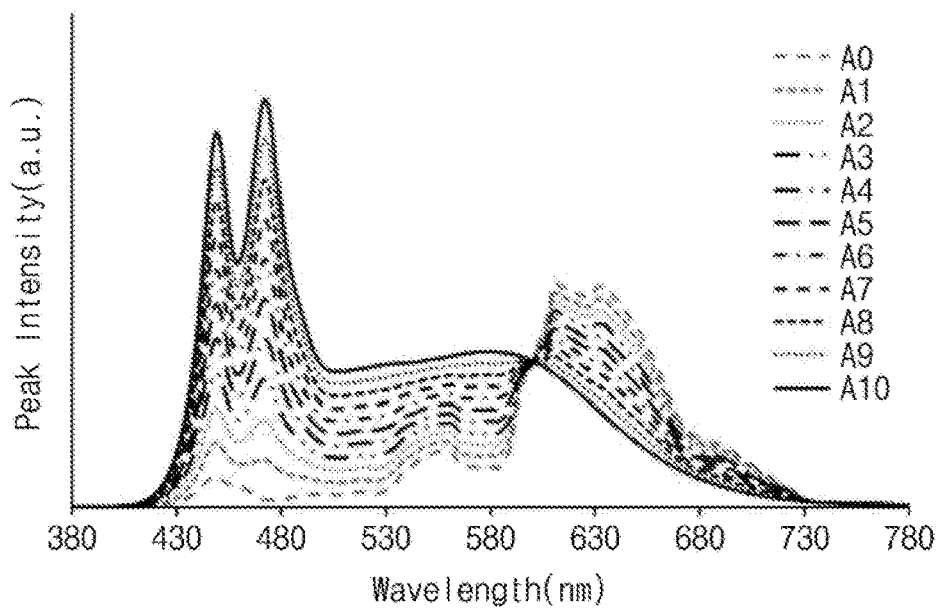
FIG. 8A illustrates a spectrum showing intensities depending on color temperatures obtained from a light emitting module according to some exemplary embodiments of the present inventive concepts.

FIG. 8A illustrates a spectrum showing intensities depending on color temperatures obtained from a light emitting module according to some exemplary embodiments of the present inventive concepts. FIG. 8A shows spectral data of the third white light WL3 obtained when the first light emitting package 40 has a color temperature of about 1,500 K and the second light emitting package 50 has a color temperature of about 10,000 K.

In FIG. 8A, A0 to A10 may indicate embodiments in which the drive controller 20 controls a ratio of drive currents applied to the first light emitting package 40 and the second light emitting package 50. Because the color temperatures of the first and second light emitting packages 40 and 50 are respectively about 1,500 K and 10,000 K, the drive current ratio (e.g., 1,500 K:10,000 K) may be controlled to achieve various color temperatures within a range of 1,500 K to 10,000 K.

Table 1 below shows measured intensities of spectrums of the third white light WL3 according to the present embodiments A0 to A10. In Table 1 below, B indicates spectral intensity at the same wavelength band as that of the first blue light L1 and the second blue light L2 discussed above, and SB denotes spectral intensity at the same wavelength band as that of the third blue light L3 discussed above. G1, G2, and Y may mean spectral intensities at wavelength bands of about 520 nm to about 540 nm, about 540 nm to about 560 nm, and about 570 nm to about 590 nm, respectively. For example, B, SB, G1, G2, and Y may express spectral intensities at wavelength bands whose peak wavelengths are 450 nm, 480 nm, 530 nm, 550 nm, and 580 nm, respectively. Hereinafter, each spectral intensity may be a relative intensity with respect to B whose value is converted into 1.

TABLE 1

| Drive current ratio | B | SB | B + SB | G1 | G2 | Y | Y (ref) | Y(Y/Y(ref)) |
|---|---|---|---|---|---|---|---|---|
| 10:0 (A0) | 1 | 0.29 | 1.29 | 0.57 | 1.71 | 1.36 | 5.67 | 24% |
| 9:1 (A1) | 1 | 0.74 | 1.74 | 0.45 | 0.94 | 0.81 | 2.61 | 31% |
| 8:2 (A2) | 1 | 0.88 | 1.88 | 0.43 | 0.71 | 0.63 | 1.66 | 38% |
| 7:3 (A3) | 1 | 0.96 | 1.96 | 0.41 | 0.62 | 0.57 | 1.30 | 44% |
| 6:4 (A4) | 1 | 1.00 | 2.00 | 0.40 | 0.53 | 0.52 | 1.02 | 51% |
| 5:5 (A5) | 1 | 1.03 | 2.03 | 0.39 | 0.49 | 0.48 | 0.81 | 59% |

TABLE 1-continued

| Drive current ratio | B | SB | B + SB | G1 | G2 | Y | Y (ref) | Y(Y/Y(ref)) |
|---|---|---|---|---|---|---|---|---|
| 4:6 (A6) | 1 | 1.04 | 2.04 | 0.39 | 0.46 | 0.46 | 0.69 | 67% |
| 3:7 (A7) | 1 | 1.06 | 2.06 | 0.38 | 0.44 | 0.45 | 0.59 | 76% |
| 2:8 (A8) | 1 | 1.07 | 2.07 | 0.38 | 0.42 | 0.43 | 0.50 | 86% |
| 1:9 (A9) | 1 | 1.08 | 2.08 | 0.38 | 0.4 | 0.42 | 0.44 | 96% |
| 0:10 (A10) | 1 | 1.09 | 2.09 | 0.38 | 0.39 | 0.42 | 0.39 | 109% |

Further, Table 2 below shows optical properties of the third white light WL3 according to the present embodiments A0 to A10. The spectrum of the third white light WL3 illustrated in FIG. 8A indicates optical properties and human-centric indices shown in Table 2 below. A correlated color temperature (CCT), a color rendering index (CRI), and a linear distance (Du'v') from a reference light source at the same CCT are measured as the optical properties, and a melanopic daylight equivalent factor (MDEF) is gauged as the human-centric index.

TABLE 2

| Drive current ratio | CCT | CRI | Du'v' | MDEF |
|---|---|---|---|---|
| 10:0 (A0) | 1510 | 86 | −0.012 | 0.23 |
| 9:1 (A1) | 1843 | 78 | −0.024 | 0.43 |
| 8:2 (A2) | 2236 | 75 | −0.031 | 0.60 |
| 7:3 (A3) | 2734 | 76 | −0.033 | 0.73 |
| 6:4 (A4) | 3396 | 76 | −0.032 | 0.85 |
| 5:5 (A5) | 4248 | 78 | −0.029 | 0.94 |
| 4:6 (A6) | 5240 | 80 | −0.024 | 1.03 |
| 3:7 (A7) | 6308 | 82 | −0.018 | 1.10 |
| 2:8 (A8) | 7425 | 84 | −0.013 | 1.16 |
| 1:9 (A9) | 8596 | 85 | −0.007 | 1.22 |
| 0:10 (A10) | 9828 | 85 | −0.003 | 1.27 |

Table 1 shows an example of spectral intensity Y at a yellow-color wavelength band of the third white light WL3 according to the present embodiments A0 to A10. Table 1 also shows an example of spectral intensity Y(ref) of yellow light as a reference light at each color temperature. For convenience of description, the yellow light as the reference light is referred to hereinafter as a reference yellow light. Referring to Tables 1 and 2, when the light emitting module 1 has a color temperature within a range of about 1,500 K to about 3,000 K (A0 to A3), the intensity ratio Y/Y(ref) of yellow light may have a value equal to or less than 50% in accordance with the present inventive concepts.

Within a color temperature range of about 1,500 K to 3,000 K, the light emitting module 1 may emit white light whose yellow color component is low. Such white light may be emitted due to the filter member 446 of the first light emitting package 40 discussed above. Therefore, according to some exemplary embodiments of the present inventive concepts, white light may be provided for human-friendly illumination.

The third white light WL3 according to the present embodiments A0 to A10 may have a relative intensity SB/B, which ranges from 0.2 to 1.1, of the second peak wavelength with respect to the first peak wavelength. The third white light WL3 may have a relative intensity Y/B, which ranges from 0.4 to 1.4, of the third peak wavelength with respect to the first peak wavelength. The third white light WL3 may have relative intensities G1/B and G2/B, each of which ranges from 0.3 to 1.8, of the fourth peak wavelength with respect to the first peak wavelength.

The intensity ratio Y/Y(ref) of yellow light may be obtained by using the light emitting module 1, which includes the first light emitting package 40 having the filter member 446 and the second light emitting package 50 having no filter member. Accordingly, this result may also be obtained when the light emitting module 1 includes only the first light emitting package 40.

Figure 8B:
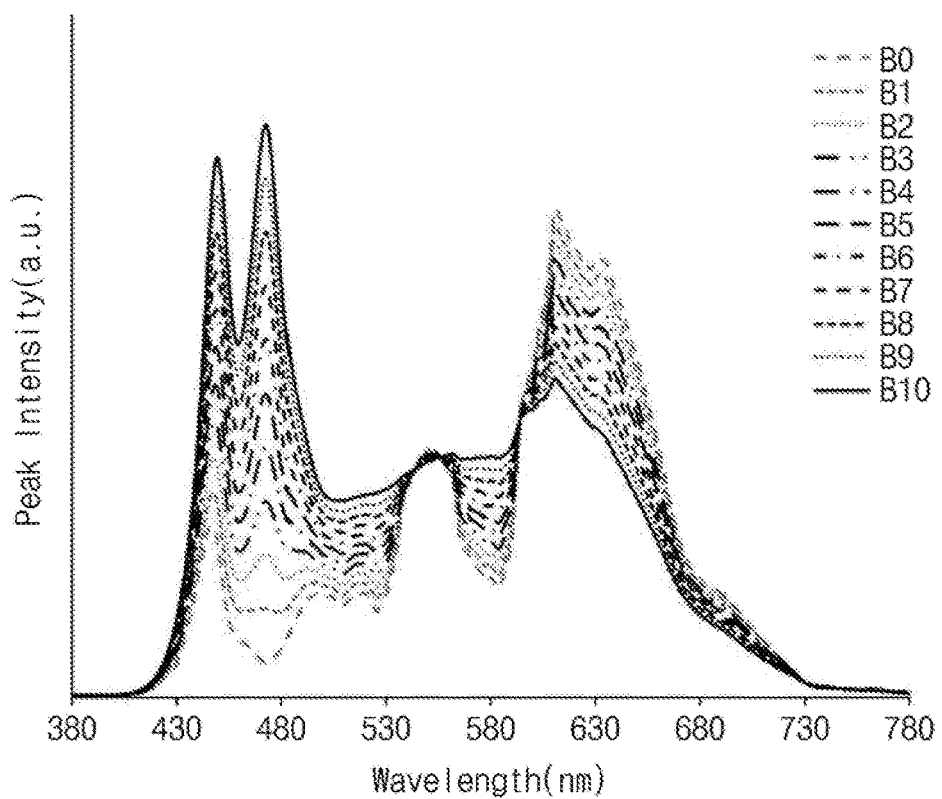
FIG. 8B illustrates a spectrum showing intensities depending on color temperatures obtained from a light emitting module according to some exemplary embodiments of the present inventive concepts.

FIG. 8B illustrates a spectrum showing intensities depending on color temperatures obtained from a light emitting module according to some exemplary embodiments of the present inventive concepts. For example, in FIG. 8B, the first light emitting package 40 may have a color temperature of about 2,200 K, and the second light emitting package 50 may have a color temperature of about 6,500 K.

In FIG. 8B, B0 to B10 may indicate embodiments in which the drive controller 20 controls a ratio of drive currents applied to the first light emitting package 40 and the second light emitting package 50. Because the color temperatures of the first and second light emitting packages 40 and 50 are respectively about 2,200 K and 6,500 K, the drive current ratio (e.g., 2,200 K to 6,500 K) may be controlled to achieve various color temperatures within a range from 2,200 K to 6,500 K.

Table 3 below shows measured spectral intensities of the third white light WL3 according to the present embodiments B0 to B10. In Table 3 below, column B indicates spectral intensity at the same wavelength band as that of the first blue light L1 and the second blue light L2 discussed above, and column SB denotes spectral intensity at the same wavelength band as that of the third blue light L3 discussed above. Columns G1, G2, and Y may mean spectral intensities at wavelength bands of about 520 nm to about 540 nm, about 540 nm to about 560 nm, and about 570 nm to about 590 nm, respectively. For example, columns B, SB, G1, G2, and Y may express spectral intensities at wavelength bands whose peak wavelengths are 450 nm, 480 nm, 530 nm, 550 nm, and 580 nm, respectively. The following spectral intensities are relative intensities with respect to column B.

TABLE 3

| Drive current ratio | B | SB | B + SB | G1 | G2 | Y | Y (ref) | Y(Y/Y(ref)) |
|---|---|---|---|---|---|---|---|---|
| 10:0 (B0) | 0.33 | 0.07 | 0.40 | 0.22 | 0.51 | 0.25 | 0.76 | 33% |
| 9:1 (B1) | 0.42 | 0.19 | 0.61 | 0.25 | 0.52 | 0.28 | 0.79 | 35% |
| 8:2 (B2) | 0.52 | 0.31 | 0.83 | 0.28 | 0.54 | 0.32 | 0.82 | 39% |
| 7:3 (B3) | 0.63 | 0.45 | 1.08 | 0.31 | 0.56 | 0.36 | 0.85 | 42% |
| 6:4 (B4) | 0.74 | 0.59 | 1.33 | 0.35 | 0.58 | 0.40 | 0.88 | 45% |
| 5:5 (B5) | 0.87 | 0.75 | 1.62 | 0.39 | 0.60 | 0.45 | 0.92 | 49% |
| 4:6 (B6) | 1.00 | 0.92 | 1.92 | 0.43 | 0.62 | 0.50 | 0.95 | 53% |
| 3:7 (B7) | 1.15 | 1.11 | 2.26 | 0.48 | 0.65 | 0.55 | 0.98 | 56% |
| 2:8 (B8) | 1.31 | 1.32 | 2.63 | 0.53 | 0.68 | 0.61 | 1.00 | 61% |
| 1:9 (B9) | 1.49 | 1.54 | 3.03 | 0.59 | 0.71 | 0.68 | 1.03 | 66% |
| 0:10 (B10) | 1.69 | 1.79 | 3.48 | 0.65 | 0.74 | 0.76 | 1.06 | 72% |

Further, Table 4 below shows optical properties of the third white light WL3 according to the present embodiments B0 to B10.

TABLE 4

| Drive current ratio | CCT | CRI | Du'v' | MDEF |
|---|---|---|---|---|
| 10:0 (B0) | 2325 | 88 | −0.010 | 0.42 |
| 9:1 (B1) | 2511 | 88 | −0.014 | 0.50 |
| 8:2 (B2) | 2724 | 87 | −0.018 | 0.57 |
| 7:3 (B3) | 2971 | 86 | −0.020 | 0.65 |
| 6:4 (B4) | 3259 | 85 | −0.022 | 0.72 |

TABLE 4-continued

| Drive current ratio | CCT | CRI | Du'v' | MDEF |
|---|---|---|---|---|
| 5:5 (B5) | 3600 | 84 | −0.023 | 0.79 |
| 4:6 (B6) | 4000 | 84 | −0.023 | 0.86 |
| 3:7 (B7) | 4468 | 83 | −0.023 | 0.92 |
| 2:8 (B8) | 5007 | 83 | −0.022 | 0.98 |
| 1:9 (B9) | 5619 | 82 | −0.020 | 1.04 |
| 0:10 (B10) | 6308 | 82 | −0.018 | 1.10 |

Table 3 shows an example of spectral intensity Y at a yellow color wavelength band of the third white light WL3 according to the present embodiments B0 to B10. Table 3 also shows an example of spectral intensity Y(ref) of a reference yellow light at each color temperature. Referring to Tables 3 and 4, when the light emitting module 1 has a color temperature within a range of about 1,500 K to about 3,000 K (B0 to B3), the intensity ratio Y/Y(ref) of yellow light may be equal to or less than 50%. In addition, when the light emitting module 1 has a color temperature within a range of about 3,000 K to about 10,000 K (B4 to B10), the intensity ratio Y/Y(ref) of yellow light it may be equal to or more than 50%.

Within a color temperature range of about 1,500 K to 3,000 K, the light emitting module 1 may emit white light whose yellow color component is low. Such white light may be emitted due to the filter member 446 of the first light emitting package 40 discussed above. Therefore, according to some exemplary embodiments of the present inventive concepts, white light may be provided for human-friendly illumination.

Figure 9A:
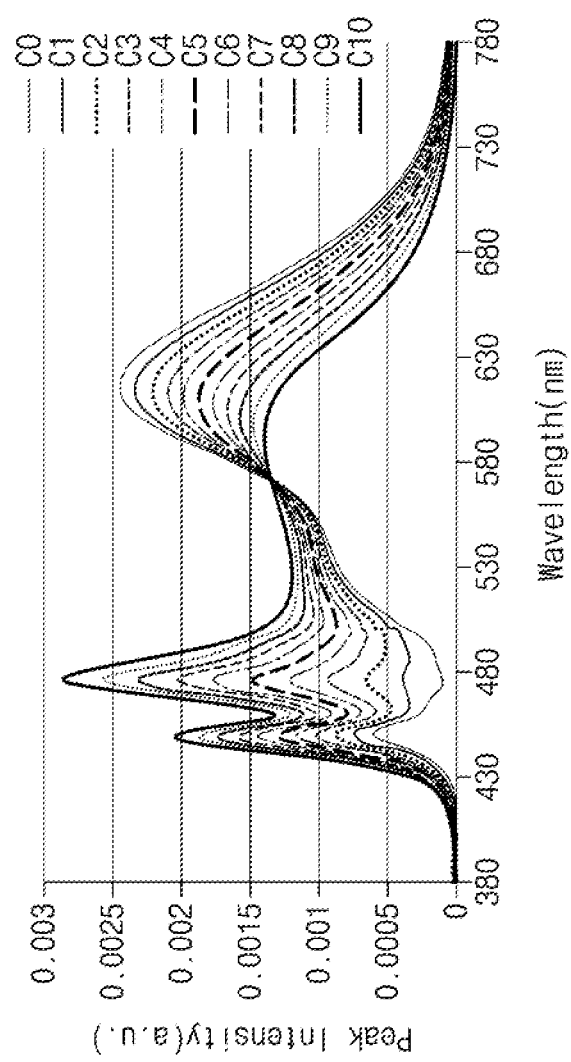
FIG. 9A illustrates a spectrum showing peak intensities depending on wavelengths obtained from a light emitting module according to some exemplary embodiments of the present inventive concepts.

FIG. 9A illustrates a spectrum showing peak intensities depending on wavelengths obtained from a light emitting module according to some exemplary embodiments of the present inventive concepts. FIG. 9A shows spectral data of the third white light WL3 obtained when the first light emitting package 40 has a color temperature of about 2,200 K and the second light emitting package 50 has a color temperature of about 4,000 K.

In FIG. 9A, C0 to C10 may indicate embodiments in which the drive controller 20 controls a ratio of drive currents applied to the first light emitting package 40 and the second light emitting package 50. Because the color temperatures of the first and second light emitting packages 40 and 50 are respectively about 2,200 K and 4,000K, the drive current ratio (e.g., 2,200 K:4,000K) may be controlled to achieve various color temperatures within a range from 2,200 K to 4,000K.

Table 5 shows color temperatures of the first light emitting package 40, color temperatures of the second light emitting package 50, and drive current ratios. Table 5 may provide relational expressions of peak wavelength ratios depending on x-values in a CIE chromaticity diagram of light emitting modules according to embodiments and comparative examples. For comparative examples, the third light emitting device 520 of the second light emitting package 50 may have a peak wavelength which may be respectively similar to that of the second light emitting device 510. In certain embodiments, the first white light WL1 may have a color temperature ranging from 2,000 K to 4,000 K, and the second white light WL2 may have a color temperature ranging from 4,000 K to 7,000 K.

TABLE 5

|  | Emb. B | Emb. C | Emb. D | Comp. E | Comp. F |
|---|---|---|---|---|---|
| Temp. of first light emitting package 40 | 2,200 K | 2,200 K | 4,000 K | 2,200 K | 2,200 K |
| Temp. of second light emitting package 50 | 6,500 K | 4,000 K | 6,500 K | 6,500 K | 4,000 K |
| Drive current ratio | 10:0 (B0) | 10:0 (C0) | 10:0 (D0) | 10:0 (E0) | 10:0 (F0) |
|  | 9:1 (B1) | 9:1 (C1) | 9:1 (D1) | 9:1 (E1) | 9:1 (F1) |
|  | 8:2 (B2) | 8:2 (C2) | 8:2 (D2) | 8:2 (E2) | 8:2 (F2) |
|  | 7:3 (B3) | 7:3 (C3) | 7:3 (D3) | 7:3 (E3) | 7:3 (F3) |
|  | 6:4 (B4) | 6:4 (C4) | 6:4 (D4) | 6:4 (E4) | 6:4 (F4) |
|  | 5:5 (B5) | 5:5 (C5) | 5:5 (D5) | 5:5 (E5) | 5:5 (F5) |
|  | 4:6 (B6) | 4:6 (C6) | 4:6 (D6) | 4:6 (E6) | 4:6 (F6) |
|  | 3:7 (B7) | 3:7 (C7) | 3:7 (D7) | 3:7 (E7) | 3:7 (F7) |
|  | 2:8 (B8) | 2:8 (C8) | 2:8 (D8) | 2:8 (E8) | 2:8 (F8) |
|  | 1:9 (B9) | 1:9 (C9) | 1:9 (D9) | 1:9 (E9) | 1:9 (F9) |
|  | 0:10 (B10) | 0:10 (C10) | 0:10 (D10) | 0:10 (E10) | 0:10 (F10) |

Figure 9B:
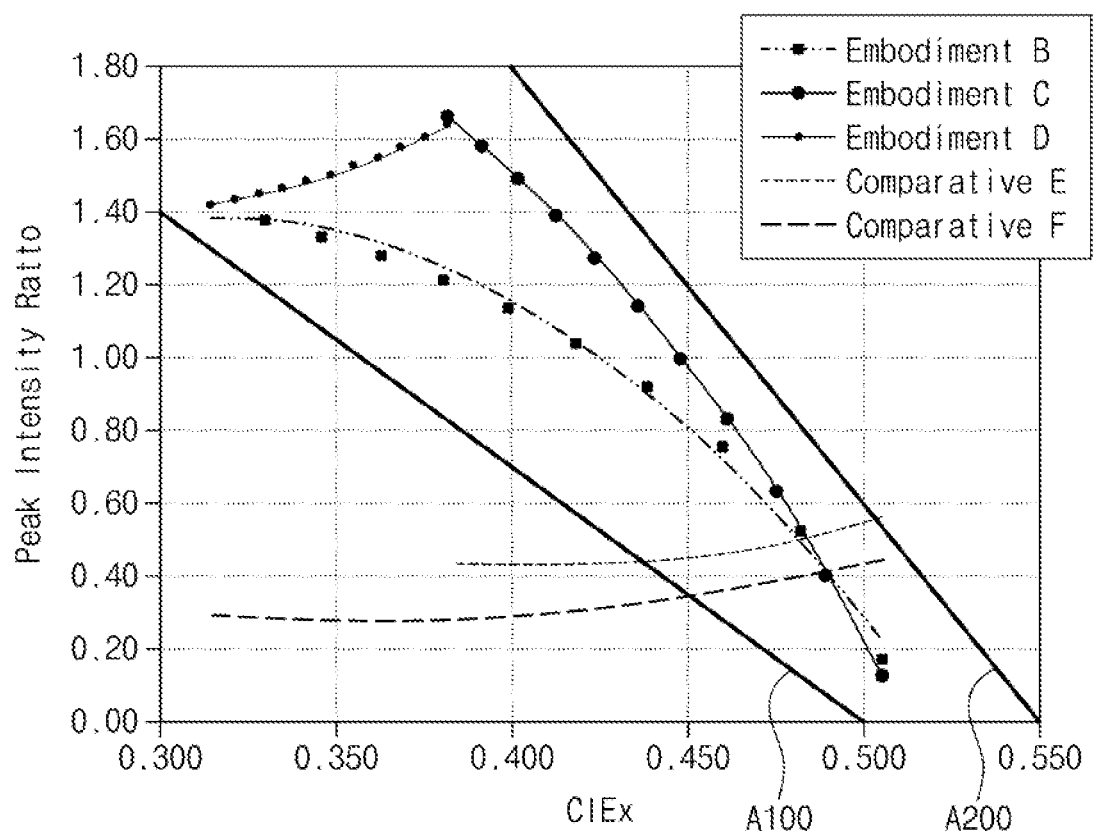
FIG. 9B illustrates a graph showing peak wavelength ratios depending on x-values in a CIE chromaticity diagram of a light emitting module according to some exemplary embodiments of the present inventive concepts.

FIG. 9B illustrates a graph showing peak wavelength ratios depending on x-values in a CIE chromaticity diagram of a light emitting module according to some exemplary embodiments of the present inventive concepts. The peak wavelength ratio is a value of the second peak wavelength with respect to the first peak wavelength of the third white light WL3.

Table 6 shows calculated results obtained from FIG. 9B showing the peak wavelength ratios depending on x-values in a CIE chromaticity diagram.

TABLE 6

| | Relational expression of peak wavelength ratio depending on x-value in CIE chromaticity diagram |
|---|---|
| Embodiment B | $y = -31.994x^2 + 20.169x - 1.7907$ |
| Embodiment C | $y = -41.575x^2 + 24.575x - 1.6662$ |
| Embodiment D | $y = -25.445x^2 - 14.508x + 3.4637$ |
| Comparative E | $y = 7.9445x^2 - 5.7131x + 1.2957$ |

Referring to FIG. 9B together with Tables 5 and 6, a quadratic polynomial may be provided as the relational expression of the peak wavelength ratio depending on an x-value in a CIE chromaticity diagram of each of Embodiment B (B0 to B10), Embodiment C (C0 to C10), Embodiment D (D0 to D10), Comparative E, and Comparative F.

For Comparatives E and F, the peak wavelength ratio depending on an x-value in a CIE chromaticity diagram may have values whose at least one is positioned outside a first relation A100 and a second relation A200. The first relation A100 and the second relation A200 may be a linear polynomial. The first relation A100 may correspond to an expression of −7x+3.5. The second relation A200 may correspond to an expression of −12x+6.6.

For Embodiments B (B0 to B10), C (C0 to C10) and D (D0 to D10), the peak wavelength ratio depending on an x-value in a CIE chromaticity diagram may have values positioned between the first relation A100 and the second relation A200, not outside the first relation A100 and the second relation A200. As one example, for Embodiments B (B0 to B10), C (C0 to C10), and D (D0 to D10), the relational expression of the peak wavelength ratio depending on an x-value in a CIE chromaticity diagram may be positioned between the first relation A100 and the second relation A200. Therefore, the light emitting module 1 may provide white light for human-friendly illumination.

When a quadratic polynomial is provided as the relational expression of the peak wavelength ratio depending on an x-value in a CIE chromaticity diagram of the third white light WL3, and when the quadratic polynomial has a secondary coefficient ranging between −45 and −30, the light emitting module 1 may provide white light for more human-friendly illumination. For Embodiments B (B0 to B10) and C (C0 to C10), the relational expression of the peak wavelength ratio depending on an x-value in a CIE chromaticity diagram of the third white light WL3 may correspond to a quadratic polynomial having a second coefficient ranging from −45 and −30. Therefore, the light emitting module 1 according to Embodiments B (B0 to B10) and C (C0 to C10) may provide white light for more human-friendly illumination.

According to the present inventive concepts, the light emitting module 1 may include the first light emitting package 40 having a low MDEF index and increasing the secretion of melatonin and also include the second light emitting package 50 having a high MDEF index and suppressing the secretion of melatonin. As a result, the light emitting module 1 may provide white light for more human-friendly illumination. For example, the first light emitting package 40 may allow users to take a comfortable rest and be suitable for illumination in the evening or night, and the second light emitting package 50 may increase activity of users and be suitable for illumination in the morning or daytime.

Figure 10:
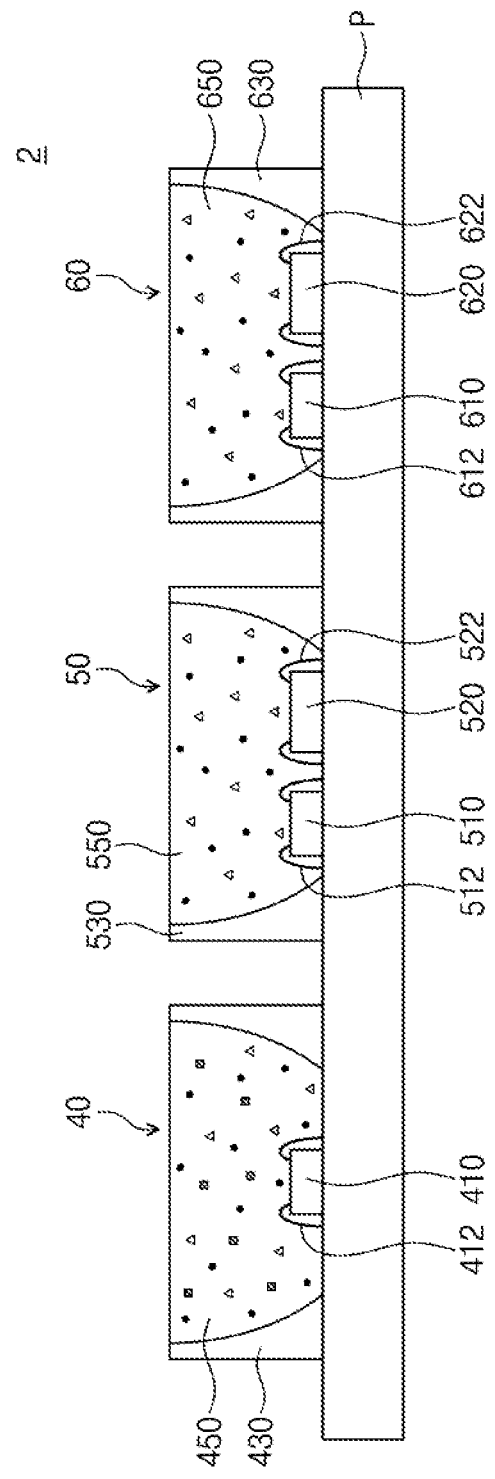
FIG. 10 illustrates a simplified cross-sectional view showing a light emitting module according to some exemplary embodiments of the present inventive concepts.

FIG. 10 illustrates a simplified cross-sectional view showing a light emitting module 2 according to some exemplary embodiments of the present inventive concepts. Those parts substantially identical or similar to those of the light emitting module 1 discussed with reference to FIGS. 2 to 4 are allocated the same reference numerals thereto, and repetitive explanations thereof will be omitted.

The light emitting module 2 of FIG. 10 may further include a third light emitting package 60. The third light emitting package 60 may include a fourth light emitting device 610, a fifth light emitting device 620, a third housing 630, and a third wavelength conversion part 650. The fourth light emitting device 610, the fifth light emitting device 620, the third housing 630, and the third wavelength conversion part 650 of the third light emitting package 60 may be respectively identical or similar to the second light emitting device 510, the third light emitting device 520, the second housing 530, and the second wavelength conversion part 550 of the second light emitting package 50 discussed above.

The third light emitting package 60 may emit a fourth white light (not shown). The fourth white light may have a color temperature between that of the first white light WL1 and that of the second white light WL2. The fourth white light may have color rendition greater than that of each of the first white light WM and the second white light WL2. The fourth white light may also and have other properties (e.g., LER) superior to those of the first white light WL1 and the second white light WL2. In certain embodiments, to emit light having a specific color temperature, one or more of the first white light WL1, the second white light WL2, and the fourth white light may be selectively turned on or off depending on required properties.

Figure 11:
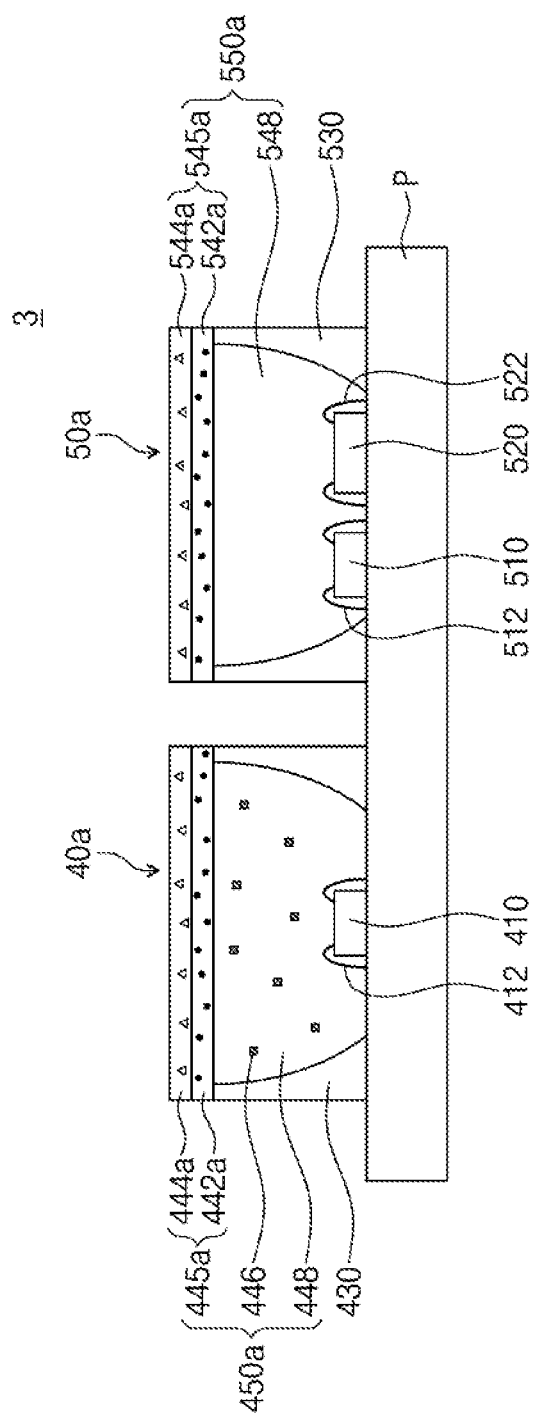
FIG. 11 illustrates a simplified cross-sectional view showing a light emitting module according to some exemplary embodiments of the present inventive concepts.

FIG. 11 illustrates a simplified cross-sectional view showing a light emitting module 3 according to some exemplary embodiments of the present inventive concepts. Those parts substantially identical or similar to those of the light emitting module 1 discussed with reference to FIGS. 2 to 4 are allocated the same reference numerals thereto, and repetitive explanations thereof will be omitted.

A first wavelength conversion part 450a may include third and fourth wavelength conversion materials each of which is provided in the form of a film. The third wavelength conversion film 442a may include third wavelength conversion material. The fourth wavelength conversion film 444a may include fourth wavelength conversion material. The third wavelength conversion film 442a and the fourth wavelength conversion film 444a may be stacked in the first housing 430 and the first light transmitting resin 448. The first light transmitting resin 448 may include only the filter member 446.

A second wavelength conversion part 550a may include fifth and sixth wavelength conversion materials each of which is provided in the form of a film. The fifth wavelength conversion film 542a may include the fifth wavelength conversion material. The sixth wavelength conversion film 544a may include sixth wavelength conversion material. The fifth wavelength conversion film 542a and the sixth wavelength conversion film 544a may be stacked in the second housing 530 and the second light transmitting resin 548.

Figure 12:
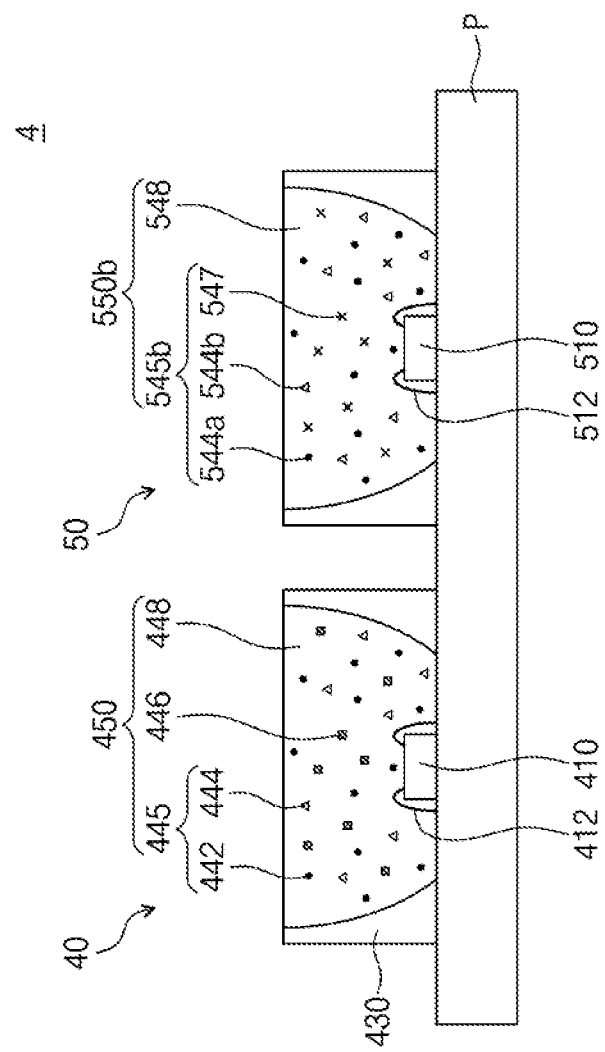
FIG. 12 illustrates a simplified cross-sectional view showing a light emitting module according to some exemplary embodiments of the present inventive concepts.

FIG. 12 illustrates a simplified cross-sectional view showing a light emitting module 4 according to some exemplary embodiments of the present inventive concepts. Those parts substantially identical or similar to those of the light emitting module 1 discussed with reference to FIGS. 2 to 4 are allocated the same reference numerals thereto, and repetitive explanations thereof will be omitted.

A second light emitting package 50b may include only the second light emitting device 510. For example, the second light emitting package 50b may include no third light emitting device discussed above. Instead, the second light emitting package 50b may further include an additional wavelength conversion material 547. The additional wavelength conversion material 547 may be excited by the second blue light (see L2 of FIG. 6) emitted from the second light emitting device 510, and thus may emit a third light having a peak wavelength of about 465 nm to about 490 nm. For example, the third light may have a peak wavelength of 480 nm.

In each of the embodiments above, examples are explained in which a light emitting module includes light emitting packages for use either in the morning/daytime or in the evening/night, but the light emitting module may be appropriately used either in the morning/daytime or in the evening/night.

For example, returning to FIG. 4, regarding the embodiments related to T1 to T6, Table 7 below shows measured spectral intensities of the third white light WL3 obtained from the first light emitting package 40 at about 1,500 K and the second light emitting package 50 at about 3,000 K. In Table 7 below, the column B indicates spectral intensity at the same wavelength band as that of the first blue light L1 and that of the second blue light L2 discussed above, and the column SB denotes spectral intensity at the same wavelength band as that of the third blue light L3 discussed above. The columns G1, G2, and Y may mean spectral intensities at wavelength bands of about 520 nm to about 540 nm, about 540 nm to about 560 nm, and about 570 nm to about 590 nm, respectively. For example, columns B, SB, G1, G2, and Y may express spectral intensities at wavelength bands whose peak wavelengths are 450 nm, 480 nm, 530 nm, 550 nm, and 580 nm, respectively. Hereinafter, each spectral intensity may be a relative intensity with respect to column B whose value is converted into 1.

TABLE 7

|  | B | SB | B + SB | G1 | G2 | Y | Y (ref) | Y(Y/Y(ref)) |
| --- | --- | --- | --- | --- | --- | --- | --- | --- |
| 3000 K (T1) | 0.77 | 0.18 | 0.95 | 0.28 | 0.57 | 0.25 | 0.85 | 30% |
| 2700 K (T2) | 0.42 | 0.15 | 0.57 | 0.28 | 0.57 | 0.25 | 0.83 | 31% |
| 2300 K (T3) | 0.33 | 0.07 | 0.40 | 0.22 | 0.51 | 0.25 | 0.76 | 32% |
| 1900 K (T4) | 0.18 | 0.05 | 0.23 | 0.16 | 0.40 | 0.22 | 0.68 | 32% |
| 1700 K (T5) | 0.13 | 0.03 | 0.16 | 0.13 | 0.34 | 0.20 | 0.64 | 31% |
| 1500 K (T6) | 0.14 | 0.04 | 0.18 | 0.08 | 0.24 | 0.19 | 0.57 | 33% |

Further, Table 8 below shows optical properties of the third white light WL3 according to the present embodiments related to T1 to T6. Referring to Table 8, any of the light emitting modules 1, 2, 3, and 4 may have a low MDEF index, and thus may be suitably used for illumination in the evening or night.

TABLE 8

|  | CCT | CRI | Du'v' | MDEF |
| --- | --- | --- | --- | --- |
| 3000 K (T1) | 2978 | 83.4 | −0.0219 | 0.64 |
| 2700 K (T2) | 2759 | 87.7 | −0.0076 | 0.53 |
| 2300 K (T3) | 2325 | 88.3 | −0.0103 | 0.42 |
| 1900 K (T4) | 1917 | 86.4 | −0.0076 | 0.32 |
| 1700 K (T5) | 1736 | 85.6 | −0.0054 | 0.28 |
| 1500 K (T6) | 1507 | 85.7 | −0.0010 | 0.23 |

By contrast, Table 9 below shows measured spectral intensities of the third white light WL3 obtained from the first light emitting package 40 at about 3,000 K and the second light emitting package 50 at about 10,000 K. In Table 9 below, B indicates spectral intensity at the same wavelength band as that of the first blue light L1 and that of the second blue light L2 discussed above, and SB denotes spectral intensity at the same wavelength band as that of the third blue light L3 discussed above. G1, G2 and Y may mean spectral intensities at wavelength bands of about 520 nm to about 540 nm, about 540 nm to about 560 nm, and about 570 nm to about 590 nm, respectively. For example, B, SB, G1, G2, and Y may express spectral intensities at wavelength bands whose peak wavelengths are 450 nm, 480 nm, 530 nm, 550 nm, and 580 nm, respectively. Hereinafter, each spectral intensity may be a relative intensity with respect to B whose value is converted into 1.

TABLE 9

| Drive current ratio | B | SB | B + SB | G1 | G2 | Y | Y (ref) | Y(Y/Y(ref)) |
|---|---|---|---|---|---|---|---|---|
| 10:0 | 1.00 | 0.97 | 1.97 | 0.84 | 0.92 | 1.09 | 1.31 | 83% |
| 9:1 | 1.00 | 0.99 | 1.99 | 0.75 | 0.81 | 0.96 | 1.16 | 83% |
| 8:2 | 1.00 | 1.00 | 2.00 | 0.68 | 0.74 | 0.86 | 1.02 | 84% |
| 7:3 | 1.00 | 1.02 | 2.02 | 0.62 | 0.67 | 0.78 | 0.93 | 84% |
| 6:4 | 1.00 | 1.04 | 2.04 | 0.57 | 0.62 | 0.70 | 0.82 | 85% |
| 5:5 | 1.00 | 1.05 | 2.05 | 0.53 | 0.56 | 0.64 | 0.74 | 86% |
| 4:6 | 1.00 | 1.06 | 2.06 | 0.49 | 0.52 | 0.58 | 0.66 | 88% |
| 3:7 | 1.00 | 1.07 | 2.07 | 0.46 | 0.48 | 0.53 | 0.59 | 90% |
| 2:8 | 1.00 | 1.00 | 1.00 | 1.00 | 1.00 | 1.00 | 1.08 | 93% |
| 1:9 | 1.00 | 1.08 | 2.08 | 0.40 | 0.42 | 0.45 | 0.46 | 97% |
| 0:10 | 1.00 | 1.09 | 2.09 | 0.38 | 0.39 | 0.42 | 0.40 | 104% |

Referring to Table 10, any of the light emitting modules 1, 2, 3, and 4 may have a high MDEF index, and thus may be suitably used for illumination in the morning or daytime. As discussed above, because the color temperatures of the first and second light emitting packages 40 and 50 are respectively about 3,000K and 10,000K, a drive current ratio (e.g., 3,000 K:10,000 K) may be controlled to achieve various color temperatures within a range from 3,000 K to 10,000 K.

TABLE 10

| 3000-10000 K. Drive current ratio | CCT | CRI | Du'v' | MDEF | Reference MDEF | MDEF (%) |
|---|---|---|---|---|---|---|
| 10:0 | 2907 | 92 | −0.015 | 0.59 | 0.51 | 116% |
| 9:1 | 3114 | 91 | −0.016 | 0.65 | 0.55 | 118% |
| 8:2 | 3365 | 90 | −0.017 | 0.7 | 0.6 | 117% |
| 7:3 | 3675 | 89 | −0.018 | 0.76 | 0.65 | 117% |
| 6:4 | 4060 | 89 | −0.018 | 0.82 | 0.72 | 114% |
| 5:5 | 4543 | 88 | −0.017 | 0.89 | 0.79 | 113% |
| 4:6 | 5147 | 88 | −0.016 | 0.96 | 0.86 | 112% |
| 3:7 | 5906 | 87 | −0.014 | 1.03 | 0.95 | 108% |
| 2:8 | 6871 | 87 | −0.011 | 1.11 | 1.03 | 108% |
| 1:9 | 8125 | 86 | −0.007 | 1.19 | 1.12 | 106% |
| 0:10 | 9828 | 85 | −0.003 | 1.27 | 1.2 | 106% |

According to some exemplary embodiments of the present inventive concepts, a light emitting module may include a first light emitting package having a relatively lower MDEF (melanopic daylight equivalent factor) index which could promote an increase in the secretion of melatonin. Additionally, some exemplary embodiments of the present inventive concepts may also include a second light emitting package having a relatively higher MDEF index which can promote suppression of the secretion of melatonin, and as a result, may provide white light for more human-friendly illumination. For example, the first light emitting package may allow users to take a comfortable rest and be suitable for illumination in the evening or night, and the second light emitting package may increase activity of users and be suitable for illumination in the morning or daytime.

The effects of the present inventive concepts are not limited to the aforementioned effects. Other effects, which are not mentioned above, will be apparently understood by one skilled in the art torn the foregoing description and accompanying drawings.

These embodiments herein are presented to facilitate understanding of the present inventive concepts and should not limit the scope of the present inventive concepts, and it is intended that the present inventive concepts cover the various combinations, the modifications, and variations. The technical protection scope of the present inventive concepts will be defined by the technical spirit of the appended claims and is intended to include all modifications and the equivalent, substantially falling within the spirit and scope of the invention while not being limited by literary descriptions in the appended claims.

What is claimed is:

1. A white light emitting module that emits a third white light, comprising:
    a first light emitting package that emits a first white light; and
    a second light emitting package that emits a second white light, the first white light and the second white light being mixed to produce the third white light,
    wherein the first light emitting package includes:
        a first light emitting device that emits a first blue light having a first peak wavelength; and
        a first wavelength conversion part that encapsulates the first light emitting device and converts at least a portion of a wavelength of the first blue light into the first white light, wherein the first wavelength conversion part includes a filter member that absorbs a wavelength component from the first blue light,
    wherein the second light emitting package includes:
        a second light emitting device that emits a second blue light;
        a third light emitting device that emits a third blue light, the second blue light having the first peak wavelength and the third blue light having a second peak wavelength; and
        a second wavelength conversion part that encapsulates the second light emitting device and the third light emitting device, the second wavelength conversion part converting at least a portion of each wavelength of the second blue light and the third blue light into the second white light,
    wherein a color temperature of the first white light is 1,500 K to 4,000 K, a color temperature of the second white light is 3,000 K to 10,000 K, the first peak wavelength is between 445 nm and 455 nm, and the second peak wavelength is between 465 nm and 495 nm, and
    wherein the third white light has a relative intensity ranging from 0.2 to 1.1 of the second peak wavelength with respect to the first peak wavelength.

2. The white light emitting module of claim 1, wherein the filter member includes one or more of neodymium (Nd) and fluorine (F).

3. The white light emitting module of claim 1, wherein the wavelength component is yellow light having a third peak wavelength between 570 nm to 590 nm, and the third white light has a relative intensity ranging from 0.4 to 1.4 of the third peak wavelength with respect to the first peak wavelength.

4. The white light emitting module of claim 3, wherein a color temperature of the third white light is 1,500 K to 3,000 K, and the third white light has a relative intensity equal to or less than 50% of the third peak wavelength with respect to a reference light whose color temperature is the same as that of the third white light.

5. The white light emitting module of claim 1, wherein the first wavelength conversion part includes:

a third wavelength conversion material that converts at least a portion of the first blue light and then emits light having a third peak wavelength between 520 nm and 560 nm, the third wavelength conversion material including at least one green phosphor selected from (Ga, Gd, Y)$_2$Al$_5$O$_{12}$:Ce, La$_3$Si$_6$Ni:Ce, Eu-doped (Sr, Ca, Ba)Si$_2$O$_2$N$_2$:Eu, (Sr, Ba)Si$_2$O$_4$:Eu, or any combination thereof; and a fourth wavelength conversion material that converts at least a portion of the first blue light and then emits light having a fourth peak wavelength between 600 nm and 645 nm, the fourth wavelength conversion material including at least one red phosphor selected from (Sr, Ca)AlSiN$_3$:Eu, CaAlSiN$_3$:Eu, K$_x$SiF$_y$:Mn$^{4+}$ ($2 \leq x \leq 3$, $4 \leq y \leq 7$), or any combination thereof.

6. The white light emitting module of claim 1, wherein a linear distance of the third white light from a reference light source is −0.001 to −0.035.

7. The white light emitting module of claim 1, wherein
a color temperature of the third white light is 3,000 K to 10,000 K, and
the third white light has a relative intensity ranging from 0.9 to 1.1 of the second peak wavelength with respect to the first peak wavelength.

8. The white light emitting module of claim 7, wherein the third white light has a relative intensity ranging from 0.3 to 1 of a fourth peak wavelength with respect to the first peak wavelength,
wherein the fourth peak wavelength is between 520 nm and 560 nm.

9. The white light emitting module of claim 1, wherein the second wavelength conversion part includes:
a fifth wavelength conversion material that converts at least a portion of each of the second blue light and the third blue light and then emits light having a fifth peak wavelength between 520 nm and 560 nm, the fifth wavelength conversion material including at least one green phosphor selected from (Ga, Gd, Y)$_2$Al$_5$O$_{12}$:Ce, La$_3$Si$_6$Ni:Ce, Eu-doped (Sr, Ca, Ba)Si$_2$O$_2$N$_2$:Eu, (Sr, Ba)Si$_2$O$_4$:Eu, or any combination thereof; and
a sixth wavelength conversion material that converts at least a portion of each of the second blue light and the third blue light and then emits light having a sixth peak wavelength between 600 nm and 645 nm, the sixth wavelength conversion material including at least one red phosphor selected from (Sr, Ca)AlSiN$_3$:Eu, CaAlSiN$_3$:Eu, K$_x$SiF$_y$:Mn$^{4+}$ ($2 \leq x \leq 3$, $4 \leq y \leq 7$), or any combination thereof.

10. The white light emitting module of claim 1, further comprising a third light emitting package that emits a fourth white light,
wherein a color temperature of the fourth white light is between the color temperature of the first white light and the color temperature of the second white light.

11. The white light emitting module of claim 1, wherein the third white light has a relational expression of a peak wavelength ratio depending on an x-value in a CIE chromaticity diagram, the relational expression having a secondary coefficient ranging from −45 to −30,
wherein the peak wavelength ratio is a value of the second peak wavelength with respect to the first peak wavelength of the third white light.

12. The white light emitting module of claim 11, wherein the color temperature of the first white light is 2,000 K to 4,000 K, and
the color temperature of the second white light is 4,000 K to 7,000 K.

13. A white light emitting module that emits a third white light, comprising:
a first light emitting package that emits a first white light; and
a second emitting package that emits a second white light, the first white light and the second white light being mixed to produce the third white light,
wherein the first light emitting package includes:
a first light emitting device that emits a first blue light having a peak wavelength between 445 nm and 455 nm;
a first wavelength conversion part that encapsulates the first light emitting device and converts at least a portion of a wavelength of the first blue light into the first white light using a first wavelength conversion material that converts the first blue light to a first converted light having a first converted wavelength peak and a second wavelength conversion material that converts the first blue light into a second converted light having a second converted wavelength peak; and
a filter member that filters the first blue light and absorbs a wavelength band between the first converted wavelength peak and the second converted wavelength peak, wherein the first converted wavelength peak is between 520 nm and 560 nm, the second converted wavelength peak is between 600 nm and 645 nm, and the absorbed wavelength band is between 570 nm to 590 nm,
wherein the second light emitting package includes:
a second light emitting device that emits a second blue light;
a third light emitting device that emits a third blue light, the second blue light having a first peak wavelength and the third blue light having a second peak wavelength; and
a second wavelength conversion part that encapsulates the second light emitting device and the third light emitting device, the second wavelength conversion part converting at least a portion of each wavelength of the second blue light and the third blue light into the second white light,
wherein a color temperature of the first white light is in a range of 1,500 K to 3,000 K, a color temperature of the second white light is in a range of 3,000 K to 10,000 K, and a color temperature of the third white light is in a range of 1,500 K to 10,000 K, and
wherein, within the range of 1,500 K to 3,000 K, the third white light has a relative intensity equal to or less than 50% of the wavelength band between 570 nm and 590 nm to a reference light whose color temperature is the same as that of the third white light.

14. The white light emitting module of claim 13, wherein the filter member includes one or more of neodymium (Nd) and fluorine (F).

15. The white light emitting module of claim 13, wherein the filter member is included in the first wavelength conversion part.

16. The white light emitting module of claim 13, wherein a linear distance of the third white light from a reference light source is −0.001 to −0.035.

17. The white light emitting module of claim 13, further comprising a third light emitting package that emits a fourth white light,
wherein a color temperature of the fourth white light is between the color temperature of the first white light and the color temperature of the second white light.

18. A light emitting module, comprising:

a first light emitting package that emits a first white light; and a second light emitting package that emits a second white light having a different color temperature than the first white light, wherein the first light emitting package includes:

a first light emitting device that emits a first blue light having a first peak wavelength between 445 nm and 455 nm; and a first wavelength conversion part that converts at least a portion of the first blue light into at least a portion of the first white light, wherein the first wavelength conversion part includes a filter member that absorbs a wavelength component from the first blue light, and wherein the second light emitting package includes:

a second light emitting device that emits a second blue light having a second peak wavelength between 445 nm and 455 nm;

a third light emitting device that emits a third blue light having a third peak wavelength between 465 nm and 495 nm; and a second wavelength conversion part that converts at least a portion of the second blue light into at least a portion of the second white light, wherein the first light emitting package is configured to emit the first white light with a first Melanopic Daylight Equivalent Factor (MDEF) index, and wherein the second light emitting package is configured to emit the second white light with a second MDEF index that is higher than the first MDEF index.

19. The light emitting module of claim 18, further comprising a control unit configured to identify a daytime period and a nighttime period, and to emit a first combination of the first white light and the second white light during the daytime period and a second combination of the first white light and the second white light during the nighttime period, wherein the first combination comprises a lower ratio of the first white light to the second white light than the second combination.

20. The light emitting module of claim 1, wherein the first light emitting package is configured to emit the first white light with a first Melanopic Daylight Equivalent Factor (MDEF) index, and the second light emitting package is configured to emit the second white light with a second MDEF index that is higher than the first MDEF index.

* * * * *